United States Patent [19]

Hitomi

[11] Patent Number: 4,596,960
[45] Date of Patent: Jun. 24, 1986

[54] CURRENT MIRROR CIRCUIT

[75] Inventor: Hisakazu Hitomi, Yokohama, Japan

[73] Assignee: Tokyo Shibaura Denki Kabushiki Kaisha, Kawasaki, Japan

[21] Appl. No.: 593,307

[22] Filed: Mar. 26, 1984

[30] Foreign Application Priority Data

Mar. 31, 1983 [JP] Japan .................................. 58-53947

[51] Int. Cl.⁴ .............................................. H03F 3/04
[52] U.S. Cl. .................................. 330/288; 323/315;
331/113 R
[58] Field of Search .............................. 330/257, 288;
323/315–317

[56] References Cited

FOREIGN PATENT DOCUMENTS 2445134 3/1975 Fed. Rep. of Germany .
3221852 1/1983 Fed. Rep. of Germany .
0000611 1/1980 Japan .................................. 330/288

Primary Examiner—James B. Mullins
Attorney, Agent, or Firm—Cushman, Darby & Cushman

[57] ABSTRACT

A current mirror circuit capable of accurately setting the ratio between input current and output current. The circuit includes a plurality of input terminals and a plurality of output terminals. A plurality of transistor pairs is provided with the first transistor of each pair having its collector connected to an input terminal. In addition, the collector of each first transistor in each pair is coupled to its own base. The bases of the transistors in each pair are coupled together, while the collector of the second transistor in each pair is coupled to an output terminal. The transistors connected to input terminals have their emitters coupled together and grounded through a first resistor. The transistors coupled to output terminals have their emitters coupled together and are grounded through a second resistor. Such a circuit allows ratios between input and output current to be set very accurately.

2 Claims, 7 Drawing Figures

F I G. 3
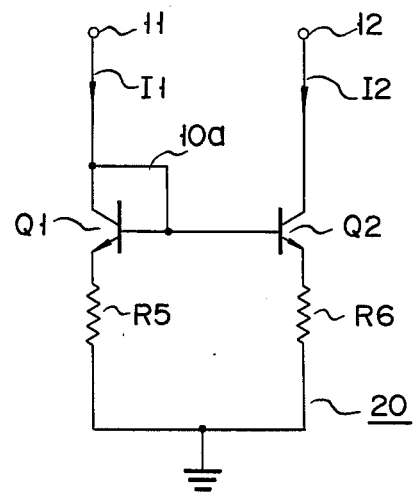
F I G. 4
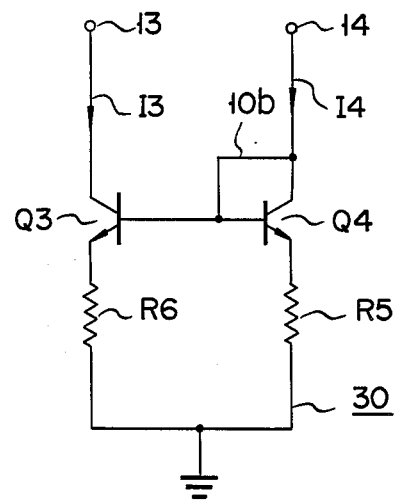

CURRENT MIRROR CIRCUIT

BACKGROUND OF THE INVENTION

The present invention relates to a current mirror circuit and, more particularly, to an improved current mirror circuit having a plurality of input terminals and output terminals, whereby a desired input/output current ratio can be obtained with a high degree of accuracy.

The above-mentioned current mirror circuit having a plurality of input terminals and output terminals is constituted in such a manner than input currents are selectively supplied to those plurality of input terminals, thereby allowing output currents to be selectively introduced from those plurality of output terminals.

FIG. 1 shows a conventional current mirror circuit 1 which can be thought of as having the constitution mentioned above. This current mirror circuit 1 has two sets of transistor pairs $Q_1$, $Q_2$ and $Q_3$, $Q_4$ whose bases are interconnected, respectively. Each emitter of these transistors $Q_1$, $Q_2$, $Q_3$, and $Q_4$ is grounded respectively through their corresponding resistors $R_1$, $R_2$, $R_3$, and $R_4$. In this example, the means 10a and 10b for supplying base currents to each base of the transistor pairs $Q_1$, $Q_2$ and $Q_3$, $Q_4$ are formed as follows. The means 10a is formed by connecting the collector and the base of the transistor $Q_1$. The means 10b is formed by connecting the collector and the base of the transistor $Q_4$.

In the above-mentioned current mirror circuit 1, the collectors of the transistors $Q_1$ and $Q_4$ are correspondingly connected to input terminals 5 and 6, respectively. Output terminals 8 and 9, responsive to these input terminals 5 and 6, are connected to the collectors of the transistors $Q_2$ and $Q_3$, respectively.

The operation of the current mirror circuit 1 will now be described.

A control current I is alternately supplied from an input terminal of the control current (CONTROL CURRENT IN) through a switching circuit 3 to the input terminals 5 and 6 of the current mirror circuit 1. Now, assuming that a change-over switch in the switching circuit 3 has been switched to the side of the input terminal 5, an input current $I_1$ (=I) will be supplied to the collector of the transistor $Q_1$. At this time, since the bases of the transistors $Q_1$ and $Q_2$ are commonly connected and since the collector and the base of the transistor $Q_1$ are also connected, the base voltage $V_{BE1}$ to be generated at the transistor $Q_1$ is equal to the base voltage $V_{BE2}$ to be generated at the transistor $Q_2$. This allows an output current $I_2$ to flow through the collector of the transistor $Q_2$. The above-mentioned operation is also performed in substantially the similar manner as in the case where an input current $I_4$ (=I) was supplied to the input terminal 6. By allowing the input current $I_4$ to flow through the collector of the transistor $Q_4$, an output current $I_3$ can flow through the collector of the transistor $Q_3$.

In the case where the characteristics of the transistors $Q_1$, $Q_2$ and the characteristics of the transistors $Q_3$, $Q_4$ are equal, the resistance values of the resistors $R_1$, $R_2$ and the resistance values of the resistors $R_3$, $R_4$ are also equal. Thus, the input current $I_1$ becomes equal to the output current $I_2$, and the input current $I_4$ becomes equal to the output current $I_3$. At this time, in the example shown in FIG. 1, $I_2 = I_3$ since $I_1 = I_4$ (=I) and since their mutual input/output current ratios ($I_2/I_1$) and ($I_3/I_4$) also equal "1".

However, it is actually difficult to strictly make the resistance values of the resistors $R_1$ and $R_2$, and those of $R_3$ and $R_4$ coincide with each other, so that we cannot help but admitting the occurrence of variations in resistance values. Even if the values of the input currents $I_1$ and $I_4$ are made equal, the mutual values of $I_2$ and $I_3$ as the output currents do not always become equal due to variations in the resistance values.

For example, when the variation in the resistance values between the resistors $R_1$ and $R_2$, and the variation in the resistance values between the resistors $R_3$ and $R_4$ were set to be 3%, respectively, assuming that $$I_2/I_1 = R_1/R_2 = 0.97, \quad I_3/I_4 = R_4/R_3 = 1.03$$

by supposing the worst state, we will have $$I_3/I_2 = R_2/R_1 \cdot R_4/R_3 = 1.03/0.97 \approx 1.06$$

Therefore, a variation of 6% will occur between the output currents $I_2$ and $I_3$.

In addition, as it is difficult to make the resistance value coincide strictly with the above, it is also difficult to equalize the characteristics between the transistors $Q_1$ and $Q_2$, and between the transistors $Q_3$ and $Q_4$. However, the influence of the variation in the characteristics of these transistors upon the output currents $I_2$ and $I_3$ can be ignored when compared with the influence of the variation in the resistance values mentioned above.

As described above, in the conventional current mirror circuit 1, even if the input currents $I_1$ and $I_4$ are equalized, the values of the output currents $I_2$ and $I_3$ to be output in response to the respective input currents $I_1$ and $I_4$ will not become equal because of the influence from the variation in the values of the resistors $R_1$, $R_2$, $R_3$, and $R_4$. Therefore, it is impossible to correctly obtain the necessary input/output current ratios ($I_2/I_1$) and ($I_3/I_4$) of "1".

Namely, the conventional current mirror circuit 1 has the problem that when a plurality of output currents are obtained by a plurality of input currents, it is impossible to set the mutual input/output current ratios at a desired value as accurately as possible.

On the other hand, in the case of setting the input/output current ratios ($I_2/I_1$) and ($I_3/I_4$) at an arbitrary value other than "1", for instance, each resistance ratio between the resistors $R_1$ and $R_2$, and between $R_3$ and $R_4$ may be set at a proper value.

SUMMARY OF THE INVENTION

It is an object of the present invention to provide a current mirror circuit which is improved in such a manner that when a plurality of output currents are selectively obtained by a plurality of input currents to be selectively supplied, the mutual input/output current ratios have a desired value which is as accurate as possible.

A current mirror circuit according to the present invention has a plurality of sets of transistor pairs, each of which has a base current supplying circuit and each of whose bases are coupled to each other. One of the two collectors for each of the above-mentioned plurality of transistor pair sets is coupled to the corresponding input terminal to which an input current is selectively supplied. At the same time, the other collector of the transistor pairs is coupled to the corresponding output terminal from which an output current is selectively introduced. A first ohmic circuit is commonly coupled to each emitter path of one transistors which serves to supply the input current between each pair of the above plurality of transistor pair sets. A second ohmic circuit is commonly coupled to each emitter path of other transistors which serves to introduce the output current between each pair of the plurality of transistor pair sets.

According to the above-described constitution, even in the case when one set of the transistor pair operates, the current will flow through the first and second ohmic circuits. Therefore, the mutual input/output current ratios can be set at a desired value as accurately as possible.

BRIEF DESCRIPTION OF THE DRAWINGS

FIGS. 3 and 4 show an equivalent circuit diagram when the current mirror circuit of FIG. 2 was made operative;

DETAILED DESCRIPTION OF THE PREFERRED EMBODIMENT

Figure 2:
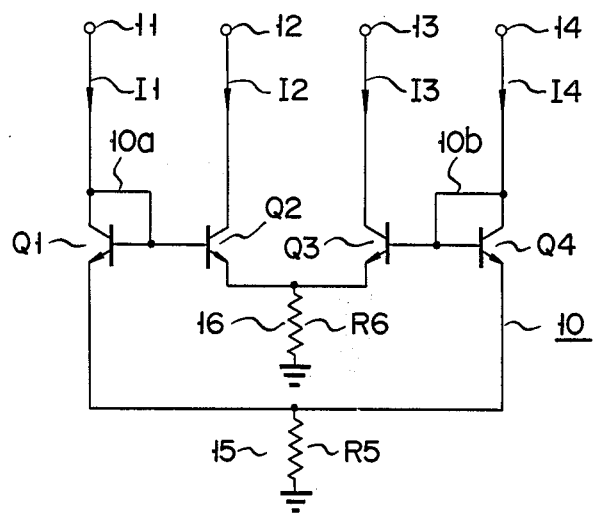
FIG. 2 is an explanatory diagram showing a constitution of one embodiment of a current mirror circuit of the present invention.

As shown in FIG. 2, a current mirror circuit 10 according to the present invention has a first transistor pair $Q_1$ and $Q_2$ whose bases are commonly connected and a second transistor pair $Q_3$ and $Q_4$ whose bases are similarly commonly connected. This current mirror circuit also has first and second base current supplying circuits 10a and 10b for supplying currents to each base of the first transistor pair $Q_1$ and $Q_2$ and the second transistor pair $Q_3$ and $Q_4$. Furthermore, this circuit has a first resistor $R_5$ as a first ohmic circuit 15, one end of which is commonly connected to each emitter of the transistors $Q_1$ and $Q_4$, and the other end of which is connected to a ground point serving as a reference potential point. This circuit also has a second resistor $R_6$ as a second ohmic circuit 16, one end of which is commonly connected to each emitter of the transistors $Q_2$ and $Q_3$, and the other end of which is connected to a ground point serving as a reference potential point. This current mirror circuit is constituted in such a manner that a first input current $I_1$ is supplied through an input current switching circuit (not shown) to the collector of the transistor $Q_1$ through the first input terminal 11, thereby obtaining the first output current $I_2$ from the collector of the transistor $Q_2$ through a first output terminal 12; and that a second input current $I_4$ is supplied to the collector of the transistor $Q_4$ through the second input terminal 14, thereby obtaining the second output current $I_3$ from the collector of the transistor $Q_3$ through a second output terminal 13.

In this example, as in the first and second base current supplying circuits 10a and 10b, the collector and the base of the transistor $Q_1$ are connected, as are the collector and the base of the transistor $Q_4$.

Figure 1:
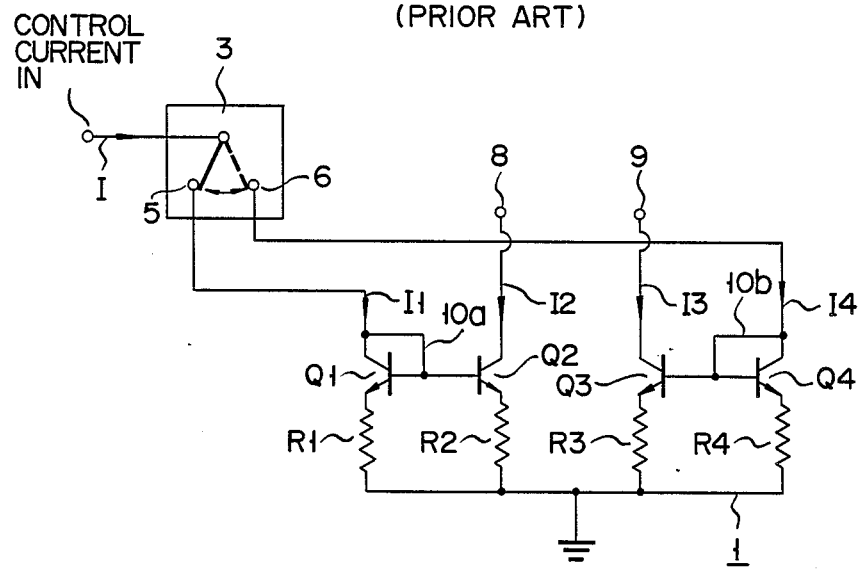
FIG. 1 is an explanatory diagram showing a constitution of a conventional current mirror circuit.

According to a circuit constitutional diagram of one embodiment of the current mirror circuit of the present invention shown in FIG. 2, there are difference as follows between the constitution of the current mirror circuit 10 of the present invention and that of the conventional current mirror circuit 1 shown in FIG. 1. In a conventional current mirror circuit, the resistors $R_1$ and $R_4$ are connected individually to each emitter of the transistors $Q_1$ and $Q_4$ to which the input currents $I_1$ and $I_4$ are supplied as in FIG. 1. In the current mirror circuit of the present invention the resistors $R_1$ and $R_4$ were replaced by the common resistor $R_5$ which serves as the first ohmic circuit 15 in FIG. 2. And the resistors $R_2$ and $R_3$ connected individually to each emitter of the transistors $Q_2$ and $Q_3$ to which the output currents $I_2$ and $I_3$ are supplied as in FIG. 1, were replaced by the common resistor $R_6$ which serves as the second ohmic circuit 16 in FIG. 2.

The operation of the current mirror circuit 10 according to the present invention will now be described. The first and second input currents $I_1$ and $I_4$ are selectively supplied to the first and second input terminals 11 and 14, respectively, so that the current mirror circuit 10 is made operative. Let us now consider the case where the first input current $I_1$ is supplied to the first input terminal 11. In this case, only the first transistor pair $Q_1$ and $Q_2$ whose bases are commonly connected are operative, while the second transistor pair $Q_3$ and $Q_4$ remains inoperative. An equivalent circuit 20 of the current mirror circuit 10 at this time is shown in FIG. 3.

In FIG. 3, assuming that base voltages $V_{BE}$ at the first transistor pair $Q_1$ and $Q_2$ are $V_{BE1}$ and $V_{BE2}$, respectively, we will have:

$$V_{BE1} + R_5 I_1 = V_{BE2} + R_6 I_2 \tag{1}$$

On the other hand, the relation between a collector current $I_C$ and the base voltage $V_{BE}$ of the transistor is generally represented by:

$$V_{BE} = V_T \ln I_C / I_S \tag{2}$$

where, $V_t$ is the thermal voltage component represented by $V_t = kT/q$ (q: unit charge, k: Boltzmann's constant, T: absolute temperature) and $I_S$ is the saturation current. The first output current $I_2$ to be output from the first output terminal 12 will be represented by:

$$I_2 = R_5/R_6 I_1 + V_T/R_6 \ln I_1/I_2 \tag{3}$$

from expressions (1) and (2).

Next, consider the case where the second input current $I_4$ is supplied to the second input terminal 14. In this case, the transistor pair $Q_3$ and $Q_4$ are operative, while the first transistor pair $Q_1$ and $Q_2$ are inoperative. An equivalent circuit 30 of the current mirror circuit 10 at this stage is shown in FIG. 4. This equivalent circuit 30 is symmetrical to the above-mentioned equivalent circuit 20 shown in FIG. 3. Actually both of the equivalent circuits are substantially identical to each other in terms of their operation. Therefore, the second output current $I_3$ to be output from the second output terminal 13 will be represented by:

$$I_3 = R_5/R_6 I_4 + V_T/R_6 \ln I_4/I_3 \tag{4}$$

Consequently, in the current mirror circuit 10 of the present invention, by supplying the first input current $I_1$ from the first input terminal 11, the first output current $I_2$ as shown in expression (3) can be obtained at the first output terminal 12. And while supplying the second input current $I_4$ from the second input terminal 14, the second output current $I_3$ as shown in expression (4) can be obtained at the second output terminal 13.

As described above, the first and second output currents $I_2$ and $I_3$ as shown respectively in expressions (3) and (4) are obtained in the current mirror circuit 10 of the present invention. It follows that the relation between the first input current $I_1$ and the first output current $I_2$ as shown in expression (3), and that the relation between the second input current $I_4$ and the second output current $I_3$ as shown in expression (4) are completely equal when $I_1=I_4$. Therefore, this current mirror circuit 10 is not influenced at all by the variation in resistance values unlike the conventional current mirror circuit 1 as the first and second output currents $I_2$ and $I_3$ become equal.

Actually, in the current mirror circuit 10 of the present invention, some variation (discordance) does exist in the values of the first and second output currents $I_2$ and $I_3$ due to the influence of variation in the characteristics of the first to fourth transistors $Q_1$ to $Q_4$. However, this variation is so small as to be negligible. In addition, this variation can be easily reduced by simply setting the emitter potentials $V_E$ of the transistors $Q_1$ to $Q_4$ to be high.

As described above, the current mirror circuit 10 of the present invention can eliminate nearly all of the variation in the values between the first and second output currents $I_2$ and $I_3$ which has been a problem in the conventional current mirror circuit 1 by way of an extremely simple constitution.

In the above embodiment, the case has been described where the respective input/output current ratios $(I_2/I_1)$ and $(I_3/I_4)$ were both set to be "1", i.e., $R_5=R_6$. However, it is also possible to obtain a desired arbitrary input/output current ratio other than "1" by selecting a different value for the resistance ratio of $R_5/R_6$.

Figure 5:
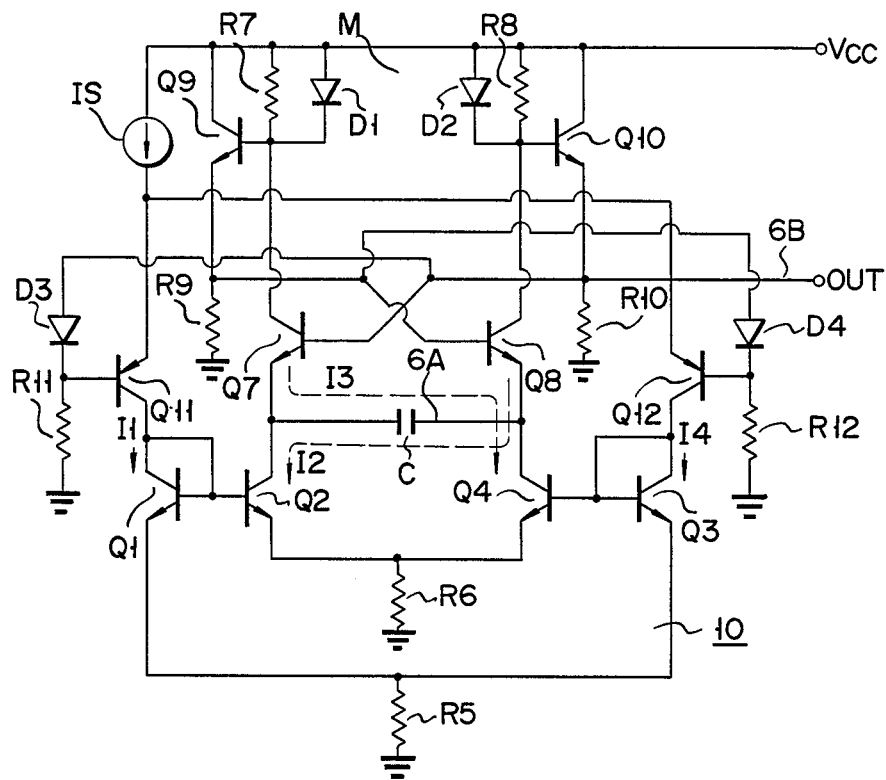
FIG. 5 is an explanatory diagram showing a constitution of an example when the current mirror circuit of the present invention was employed to control the oscillating output of a multivibrator.

FIG. 5 shows a circuit diagram when the current mirror circuit 10 of the present invention as described is applied to, for example, a multivibrator type oscillating circuit M which can be used in an FM modulator of a VTR.

That is, the above-mentioned current mirror circuit 10, consisting of the transistors $Q_1$–$Q_4$ and the resistors $R_5$ and $R_6$, is applied to control the oscillating output of the well-kown multivibrator type of oscillating circuit M, and is comprised of: transistors $Q_7$–$Q_{12}$; resistors $R_7$–$R_{10}$; diodes $D_1$ and $D_2$; and a capacitor C.

In FIG. 5, IS denotes the input curent source (modulated wave inputs, e.g., luminance signals), transistors $Q_{11}$ and $S_{12}$, diodes $D_3$ and $D_4$ and resistors $R_{11}$ and $R_{12}$ which constitute an input current switching circuit for the current mirror circuit 10.

In addition, $V_{cc}$ denotes a power voltage supply terminal, and OUT is an oscillating output terminal.

Figure 6A:
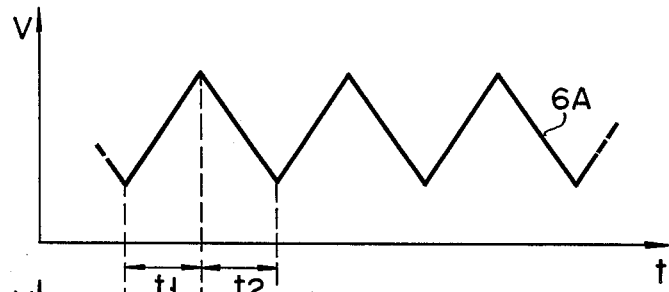
FIGS. 6A and 6B are waveform diagrams showing a voltage waveform of the capacitor of FIG. 5 and an oscillation output waveform of the multivibrator.

In this multivibrator type of oscillating circuit M, a voltage waveform 6A of the capacitor C is controlled by the output current $I_2$ and $I_3$ of the current mirror circuit 10. FIG. 6A shows a waveform diagram of the voltage waveform 6A as it crosses the capacitor C. The leading time $t_1$ and the trailing time $t_2$ of this voltage waveform 6A are represented respectively by:

$$t_1 \alpha CV_{ref}/I_2, \quad t_2 \alpha CV_{ref}/I_3$$

where $V_{ref}$ is the oscillating output voltage of the multivibrator M, and C shows the capacitance value of the capacitor C.

Figure 6B:
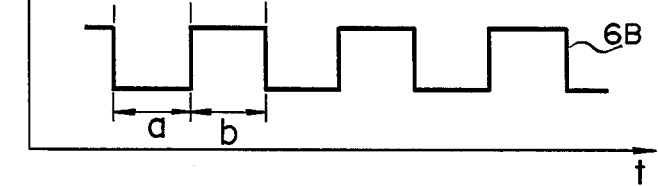

As indicated above, the leading time $t_1$ and the trailing time $t_2$ of the voltage waveform 6A as it crosses the capacitor C depend upon the output currents $I_2$ and $I_3$ of the current mirror circuit 10. The multivibrator type of oscillating circuit M sends an oscillating output 6B shown in FIG. 6B to the oscillating output terminal OUT on the basis of this output waveform 6A. Since the value of the amplitude of the voltage waveform 6A of the capacitor C is constant, the duty ratio (a:b) of the oscillating output 6B depends upon the values of the output currents $I_2$ and $I_3$. Namely, although the duty ratio (a:b) of the oscillating output 6B is determined by the gradients of the oscillating output during times $t_1$ and $t_2$, the gradients themselves depend upon the output currents $I_2$ and $I_3$ of the current mirror circuit 10. The duty ratio of the oscillating output 6B is desirably set as close to "1" as possible to avoid any problems caused by too much of the secondary harmonic. Although the values of the output currents $I_2$ and $I_3$ are required to be equal to each other, this requirement can be easily satisfied by the current mirror circuit 10 according to the present invention.

Furthermore, when the current mirror circuit 10 of the present invention is applied to control the oscillating output of the multivibrator type of oscillating circuit M as described above, there is also the possibility of driving the switching circuit at a lower voltage than what would ordinarily be thought possible.

As described in detail above, according to the present invention, it is possible to provide an excellent current mirror circuit which has been improved in such a manner that when a plurality of output currents are obtained by a plurality of input currents, the mutual input/output current ratios $(I_2/I_1)$ and $(I_3/I_4)$ can be set at a desired value as accurately as possible without being influenced due to the variation in resistors to be used.

Although the present invention has been shown and described with respect to a particular embodiment, various changes and modifications which are obvious to a person skilled in the art are deemed to lie within the spirit and scope of the invention.

For example, although the present embodiment has been shown in the case where two input terminals and two output terminals are provided using two sets of transistor pairs, the invention is not limited to this but it may be also applied to the case where three or more input terminals and three or more output terminals are provided using three sets or more of transistor pairs.

What is claimed is:

1. Current mirror apparatus comprising:
   a plurality of input terminals including at least a first input terminal receiving a first input current and a second input terminal receiving a second input current;
   a plurality of output terminals including at least a first output terminal providing a first output current and a second output terminal providing a second output current;
   a plurality of transistor pairs including at least a first pair having first and second transistors and a second pair having third and fourth transistors, the collector of said first transistor being coupled to said first input terminal, the bases of said first and second transistors being coupled together, the emitter of said first transistors being connected to the emitter of said fourth transistor through a first emitter path, the collector of said second transistor being coupled to said first output terminal, the emitter of said second transistor being coupled to the emitter of said third transistor through a second emitter path, the collector of said third transistor being coupled to said second output terminal, the bases of said third and fourth transistors being coupled together, and the collector of said fourth transistor being coupled to said second input terminal;

at least a first base current supplying circuit coupling together said first transistor collector and base, and a second base current supplying circuit coupling together said fourth transistor collector and base;

means for switching between said first and second input terminals;

a first resistor coupled between said first emitter path and ground; and a second resistor coupled between said second emitter path and ground;

whereby said first output terminal outputs the first output current when the first input current is supplied to said first input terminal, and said second output terminal outputs the second output current when the second input current is supplied to said second input terminal.

2. Apparatus according to claim 1 wherein said plurality of transistor pairs includes two transistor pairs.

* * * * *